United States Patent [19]

Laukien

[11] Patent Number: 5,270,649
[45] Date of Patent: Dec. 14, 1993

[54] METHOD AND APPARATUS FOR THE PREDICATION OF EARTHQUAKES

[76] Inventor: Gunther Laukien, Silberstreifen, 7512 Rheinstetten, Fed. Rep. of Germany

[21] Appl. No.: 875,445

[22] Filed: Apr. 29, 1992

[30] Foreign Application Priority Data

Apr. 29, 1992 [DE] Fed. Rep. of Germany ....... 4113952

[51] Int. Cl.$^5$ .............................................. G01V 3/00
[52] U.S. Cl. ..................................... 324/300; 324/301
[58] Field of Search ............... 324/300, 301, 302, 303, 324/307, 309, 318, 322, 323

[56] References Cited

U.S. PATENT DOCUMENTS 5,138,261 8/1992 Ratzel .................................. 324/318
5,148,110 9/1992 Helms .................................. 324/323

FOREIGN PATENT DOCUMENTS 1079063 4/1988 U.S.S.R. .............................. 324/301

OTHER PUBLICATIONS

Thomas Y. Canby, Can We Predict Quakes, National Geographic Jun., 1976, 830–835.
R. P. Singh and D. Rankin, The Application of VHF Measurements To Earthquake Prediction, Geophysical Prospecting 33, 1985, pp. 1232–1239 (month unknown).

*Primary Examiner*—Louis Arana
*Attorney, Agent, or Firm*—Cesari and McKenna

[57] ABSTRACT

A method and an apparatus for predicting the future occurrence of earthquakes continuously measures a physical parameter of the earth's crust by means of magnetic spin resonance measurements to develop an alarm signal. When the value of the alarm signal exceeds a threshold value, an alarm is generated.

14 Claims, 5 Drawing Sheets

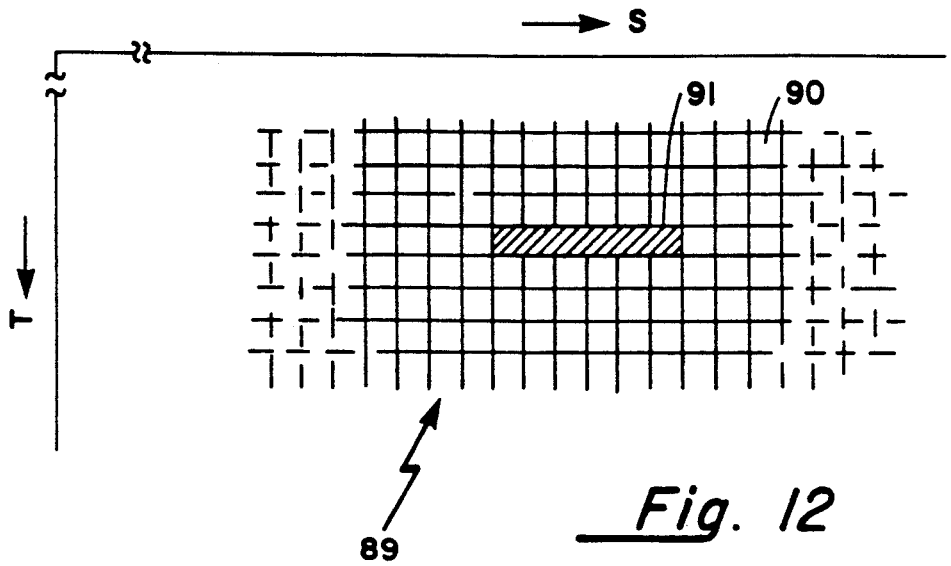
_Fig. 12_
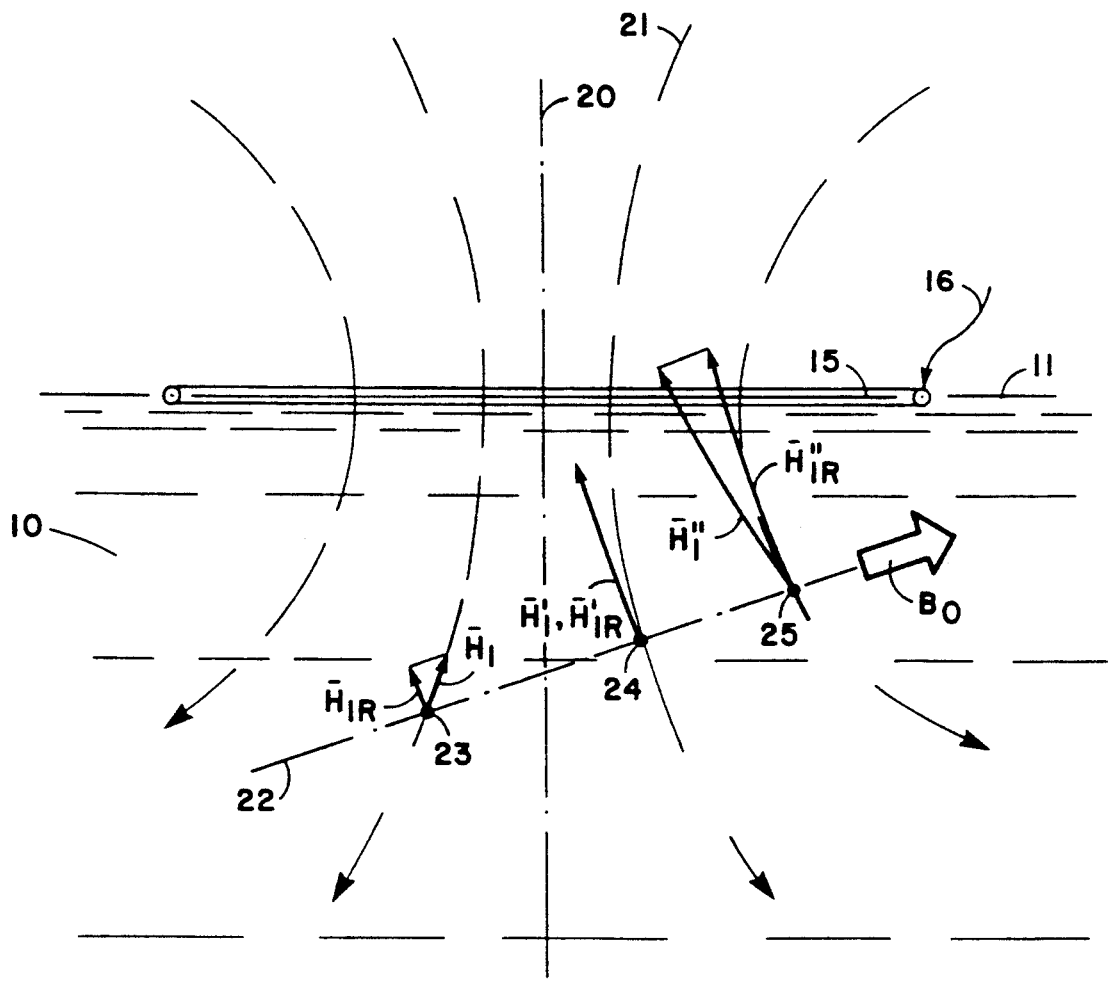
_Fig. 2_

METHOD AND APPARATUS FOR THE PREDICATION OF EARTHQUAKES

FIELD OF THE INVENTION

The invention concerns a method and an apparatus for the prediction of earthquakes with which a physical parameter of the earth's crust is continuously measured in a contact-free fashion and, when a limiting value is exceeded, an alarm is signalled.

DESCRIPTION OF THE PRIOR ART

A method and an apparatus of the above mentioned kind are known in the art from DE-OS 39 01 125.

An earthquake is a large volume shaking of the ground by which accumulated pressure in the earth's crust is suddenly equilibrated. In earthquake research one distinguishes among the so-called cave-in quakes which are a consequence of the collapse of subterranean caverns, eruptions or volcanic quakes which are released through volcanic eruptions or lava flow and finally tectonic or dislocation quakes which are manifestations accompanying shifting or dislocation in the earth's crust and in the upper earth mantle.

Whereas the cave-in quake and the eruption or volcanic quake occur rarely and usually do not exhibit large earthquake strength, the tectonic or dislocation quakes are the most common earthquakes and are also the strongest earth motions with the most far-reaching consequences.

It is known in the art that earthquakes originate at the so-called seismic focus or hypocenter at depths of up to 700 kilometers below the surface of the earth. The earthquake propagates from the seismic focus, on the one hand, radially upward to the nearest point on the earth's surface which is designated as the epicenter. On the other hand, earthquake waves also rapidly traverse the globe and, in fact, at different depths travelling diametrically through the center of the earth as well as on the earth's surface or are reflected at layers inside the earth and appear at various positions on the earth's surface far removed from the epicenter. In consequence of the finite propagation velocity of the earthquake waves, these earthquakes appear at various points on the surface of the globe with time delays which are typically in the range of several minutes.

The sudden appearance of earthquakes is caused by the occurrence of a shear breakage in the earth's crust by which parts of the earth's crust shift with respect to each other in a direction parallel to the earth's surface. Along the radially directed separation surface between two such mutually shifting portions of the earth's crust, a deformation initially occurs so that an imaginary line perpendicular to this plane is bent into an S shape along the earth's surface. Should the limiting shear pressure be attained, a sudden shear breakage takes place with the consequence that the imaginary line mentioned is straightened once again on both sides of the radial plane, however, with a certain displacement in the direction of the radial plane.

In consequence of the so-called shear fracture, longitudinal spatial waves initially spread at intermediate velocities of up to 13 km/s and travel rapidly through the earth's crust or globe in the form of density waves. In these longitudinal spatial waves the density of the material of the earth's crust changes periodically back and forth in the propagation direction. Other initial waves occur in the form of slower transverse waves with a velocity of up to 7.5 km/s with which an oscillation perpendicular to the propagation direction occurs. Then, subsequently, the yet slower surface waves propagate with a velocity of up to 3.8 km/s which, however, contain the most energy and, therefore, the more distructive force.

It is known in the art that there are certain regions of the earth's surface which are particularly endangered by earthquakes, namely the regions of the young fault ridges and fault zones particularly in the circumpacific belt as well as in the transatlantic belt, wherein approximately 90% of all earthquakes occur.

In order to protect people from the consequences of earthquakes, on the one hand, a multitude of passive protection measures are known in the art which are summarized by the collective designation of earthquake-proof construction methods.

On the other hand, a manifold of proposals have also been made for predicting the occurence of earthquakes.

Towards this end, the above mentioned DE OS 39 01 125 has proposed the prediction of impending earthquakes by means of measurement, registration and analysis of temperature increases in the vicinity of geotectonic disruption zones which are not due to climatic or daily fluctuations, but rather originate from the transformation of tectonic energy in the form of mechanical pressure effects into the heating up rocky material. With this proposal one takes into consideration that, on the occasion of the earthquake of the May 6, 1906 in the Italian province of Friaul, a rapid increase in the water temperature to approximately 30° C. was measured which was unusually high for this time of year. Corresponding observations can be extracted from a multitude of historical reports of earthquakes, by way of example, from the report of Mercalli on the earthquake of the Nov. 16, 1894 in Calabria, from the report by Immanuel Kant about the earthquake of Nov. 1, 1755 in Lisbon, and from Alexander von Humboldt with respect to the earthquake in Venezuela of 1799.

In an additional method proposed for the prediction of earthquakes which is known in the art from DE-OS 37 36 873, the prediction of earthquakes is effected through the determination and measurement of seismatic ground vibrations in the ultrasound range. Thereby one takes advantage of the realization that many animals, in particular those which live in earth cavities, are known to leave their hiding place or refuge shortly before an earthquake. Observations of this kind have, for example, been made on the occasion of the earthquake in the province of Liaoning in China in 1975. In the method known in the art it is thereby assumed that this animal behaviour is due to their sensing of ultrasound oscillations emanating from the quake region from which eruption of an earthquake will originate and, in fact, in consequence of the extremely high pressure of the earth's layers with even minimal shifts of same producing high frequency vibrations in the ultrasound range.

In contrast the classical academic method for the prediction of earthquakes is based on the measurement and analysis of seismic oscillations in the acustical or subacustical range.

In this manner it has been proposed, for example, in DE-OS 24 40 312 to effect reflection earthquake surveillance by inducing sound waves in the earth using explosive, impact, or vibration devices and detecting the reflections of these sound waves with a geophone or detectors arranged in arrays or nests on the surface of the earth. The output signals of these geophones are displayed in a form of oscillograms or oscilloscope traces having certain characteristic wave forms. These wave forms are designated as so-called seismic events and can be correlated to each other. By means of very complex mathematical methods it is possible to analyse and interprete the recorded seismograms.

Finally a simple mechanical configuration for the prediction of earthquakes is described in DE-OS 30 14 259. In this configuration which is known in the art, a pendulum is connected within an electrical circuit such that, even with a minor shaking of the solid earth's crust, the circuit closes and an alarm is thereby released.

The above mentioned classical academic methods have the disadvantage that a reliable interpretation of the seismogram is extremely difficult and up to the present time has not yet achieved the reliability which is necessary in order to, in a responsible fashion, issue an earthquake alarm with all the resulting consequences associated with same. This procedure exhibits, above all, the difficulty that unique measurable earthquake oscillations can first be measured only directly before the occurrence of the earthquake, under certain circumstances, only several minutes before the appearance of the earthquake, that is to say, at a point of time at which an earthquake warning would be much too late. Although one knows that the so-called pre-earthquakes often occur before the "large" earthquakes, the amplitude of such prequakes is, however, extremely small and, therefore, a reliable identification of a pre-earthquake as a warning for a large earthquake is extremely difficult. This is not at all possible with the simple pendulum configuration which would then already respond to the passing by of a heavy vehicle.

As far as the above mentioned procedures based on measurement of ultrasound vibrations or temperature changes are concerned, their reliability has also not yet been demonstrated.

Known in the art in a completely different context is application of the technique of nuclear magnetic resonance to include measurements in proximity to the earth's surface.

In EP-OS 237 323, towards the end of prospecting for fossil fuels, a nuclear resonance probe, after effecting a sample bore, is lowered into the bore hole and then, in the cylindrical surrounding region of the probe, measurements are undertaken by means of nuclear resonance to, in this manner, determine the presence of oil or the like.

Known in the art from DE-PCT Publication 36 90 746 is, in this context, a device for the measurement of parameters for the location of subterranean minerals with which the technique of nuclear resonance is likewise applied to discover underground deposits of nuclear resonance active minerals. Towards this end a wire loop is laid upon the earth's surface and a high frequency alternating current is sent through the wire loop in order to produce a high frequency magnetic alternating field inside of the wire loop. In conjunction with the earth's magnetic field it is possible, in this fashion, to excite a nuclear resonance and to determine, in certain layers below the earth surface, whether or not a given layer has, by way of example, a mineral containing fluid.

In neither of the last mentioned methods which are known in the art is, however, reference made to a method with which the prediction of earthquakes would be possible.

Aside from the already above mentioned lack of reliability in the methods known in the art for the prediction of earthquakes, the classical academic method (DE-OS 24 40 312) also tends toward the disadvantage, on the one hand, that due to the multitude of geophones which must be arranged at differing points along the earth's surface a more extensive measurement expenditure is required. In addition, it is never possible to exclude the possibility that, with reflection measurements utilizing the necessary primary shock by means of explosive or the like, a tectonic process is, itself, thereby initiated which, without such a shock, perhaps would never have occurred.

The above mentioned alternative procedure (DE-OS 37 36 873 and 39 01 125), in contrast, tends towards the disadvantage that phenomena on the earth's surface are measured whose sources could be due to other causes. Towards this end, a multitude of natural events are conceivable which lead to ultrasound oscillations and, furthermore, unusual temperature increases, in particular in consideration of the current climate changes, are not so characteristic that one could release a earthquake alarm based on their occurrence.

Thereby, it is the underlying purpose of the present invention to further improve a method of the above mentioned kind in such a manner that by means of measurement in a contact-free fashion, a reliable prediction of the impending occurrence of earthquakes is possible.

BRIEF SUMMARY OF THE INVENTION

This purpose is achieved in accordance with the invention in that the physical parameters are measured by means of magnetic spin resonance.

The underlying purpose of the invention is, in this manner, fully accomplished since magnetic spin resonance, that is to say, nuclear magnetic resonance (NMR) or electron spin resonance (ESR) are analytic methods with which very sensitive measurements of the most differing of physical parameters are possible. Towards this end, the magnetic spin resonance is particularly suited, by means of continually refined criteria, to ever improve the probability of a correct prediction, something which, with measurements of relatively simple natural events, such as vibrations in the acoustical or ultrasound range or temperatures of surface waters, is not possible since the latter are only characterized by one or two measurement values, whereas measured magnetic spin resonance events exhibit complete spectra which are capable of representing extremely complicated material states.

Although, as mentioned, differing methods of magnetic spin resonance are applicable within the framework of the present invention, the utilization of nuclear magnetic resonance (NMR) is particularly preferred especially since it can be excited in the earth's magnetic field in a relatively simple manner.

A further particularly important advantage of magnetic spin resonance is that volume selective measurements are possible without requiring that the volume region to be measured be located in proximity to the measurement apparatus. These volume selective measurements are known in the art in completely different areas of measurement technology, by way of example, in medical diagnostics where volume selective NMR measurements within the context of so-called nuclear spin tomography (magnetic resonance imaging) are carried out. Whereas, however, the medical diagnostic volume regions have dimensions on the order of cubic millimeters, within the framework of the present invention one would provide for volume selective measurements from volume regions of the order of magnitude of cubic meters up to cubic kilometers of the earth's crust.

As already mentioned above, the magnetic spin resonance measures the structure of the material in the form of a spectrum. This, however, does not mean that with magnetic spin resonance only "analytic" measurements are possible with which "only" the chemical composition of substances can be measured. A further degree of freedom in this type of measurement is that the chemical composition of materials can change not only within the context of the usual chemical processes but also directly under the influence of tectonically relevant physical parameters, in particular, the temperature and the pressure.

In this manner, with the method in accordance with the invention, the proposal of DE-OS 39 01 125 can, for example, be realized and a temperature increase in the vicinity of the earth's crust ca be measured by indirectly detecting the influence of the temperature increase on the chemical composition of a volume region of the earth's crust. The method in accordance with the invention is, however, not limited to this parameter, rather pressure effects or simultaneous pressure and temperature effects can also be measured as well as chemically caused changes in the chemical composition of materials, by way of example, changes in the chemical composition of ground water.

The invention thereby opens up completely new prospects for the prediction of earthquakes, be it through macroscopic measurement of an entire region of the earth's crust, be it through volume selective measurement of certain volume regions which in view of the impending earthquake eruption display particularly significant changes in state. Clearly, the above mentioned and the features explained below can be applied not only in the given combination but also in other combinations or individually without departing from the framework of the present invention.

Embodiments of the invention are represented in the drawing and are explained in more detail in the following description. Shown are:

BRIEF DESCRIPTION OF THE DRAWINGS

FIG. 2: A schematic side view of an apparatus for carrying out the method in accordance with the invention with an description of the active magnetic fields;

FIG. 12: a representation for the explanation of the two dimensional imaging procedure in accordance with the method of the invention;

DETAILED DESCRIPTION OF THE PREFERRED EMBODIMENTS

Figure 1:
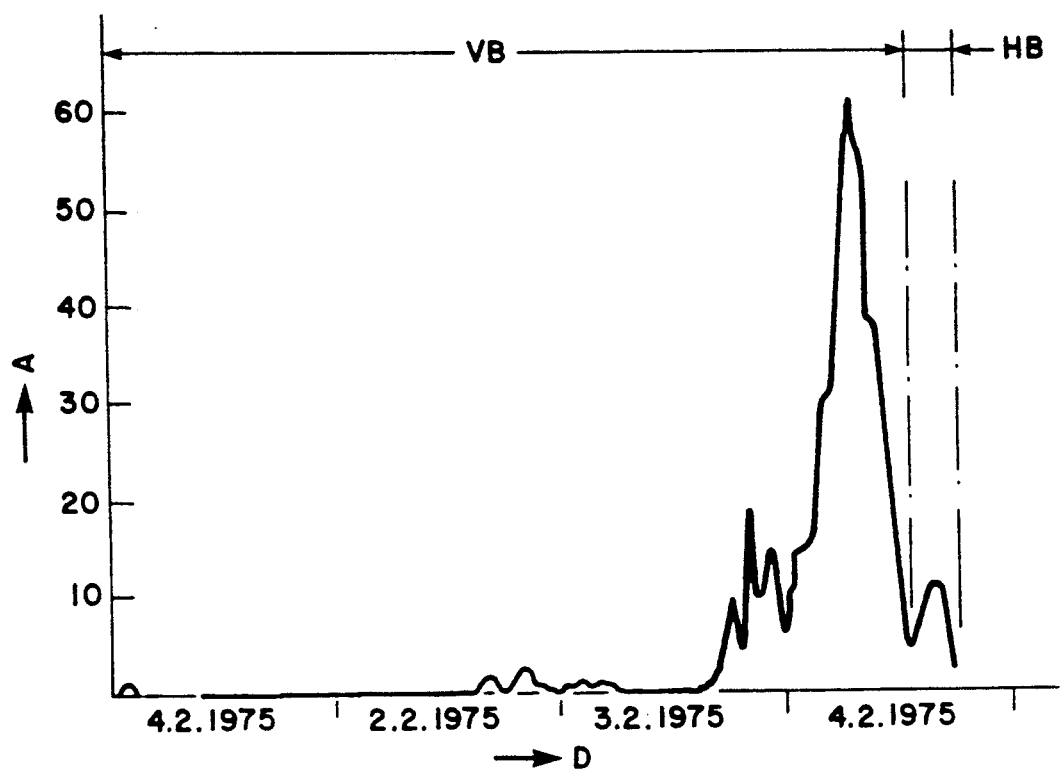
FIG. 1: The time dependence of an earthquake plotted against the earthquake's strength for an earthquake such as one which took place on Feb. 4, 1975 in the province of Liaoning/China.

FIG. 1 shows a diagram with which the calendar date D is plotted along the abscissa. Plotted along the ordinate is the number A of quakes per hour. The plot in accordance with FIG. 1 shows a measurement recorded on the occasion of the Haicheng earthquake in the province of Liaoning/China between the Feb. 1, 1975 and Feb. 4, 1975. VB represents the time region of the so-called prequake, whereas HB represents the main quake on Feb. 4, 1975.

As one can clearly see from FIG. 1, there are several isolated prequakes on Feb. 1, 1975 and Feb. 2, 1975 whose number strongly increased during Feb. 3, 1975 reaching a maximum value on Feb. 4, 1975 of approximately 60 prequakes and then, on the afternoon of the Feb. 4, 1975, the main quake indicated as 1 in FIG. 1 occurred. The magnitude of this main quake 1 reached the value of 7.3 on the so-called Richter-scale.

As is clearly indicated in FIG. 1, a plurality of prequakes occurred before the actual main quake partially with sufficient time separation prior to the occurrence of the main quake in order to allow for the release of a earthquake prewarning by which sufficient time remains in order to evacuate in an appropriate fashion or to instruct the population to undertake safety precautions.

It was already mentioned above that an earthquake or the tectonic processes which lead to the eruption of an earthquake always proceed with changes in the vicinity of the earth's crust. These changes manifest themselves typically as pressure changes, temperature changes or changes in the chemical composition of the materials of the earth's crust, whereby the last mentioned change can be either an indirect consequence of the change in temperature or pressure or a direct consequence of chemical processes.

Within the framework of the present invention, a method is then described with which it is possible to detect these types of changes with the assistance of magnetic spin resonance. Towards this end, by way of example, nuclear magnetic resonance (NMR) is applied in subsequent discussion below although, clearly, other spin resonance methods for example, electron spin resonance could also be used.

Figure 10:
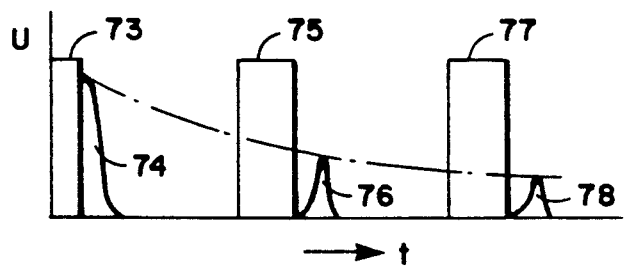
FIG. 10: A temporal representation of a pulse program for the excitation of the experiments illustrated in FIG. 7 through 9.

In FIG. 2 10 labells the earth's curst and the earth's surface. One also sees, in the side view, a transmitting coil 15 with a vertically directed coil axis 20. The transmitting coil 15 is supplied via a cable 16 with a high frequency current i so that the transmitting coil 15 produces an electromagnetic alternating field with field lines 21 whose associated complex field strength is indicated as $H_1$ on the appropriate vectors in FIG. 2.

Furthermore, in the spatial region represented in FIG. 2, the earth's magnetic field is active which is symbolically represented in FIG. 2 with an arrow $B_0$. The earth's magnetic field $B_0$ runs, in the spatial region represented in FIG. 2, in a direction 22 whose inclination with respect to the earth's surface depends on the geographical position of the corresponding spatial region and, at larger depths within the earth's crust, also on its chemical composition. One should, in this connection, mention that the macroscopic direction of the earth's magnetic field is so taken that the field lines in the vicinity of the geographical pole extend radially out of the earth's surface and then close upon themselves over the earth's surface so that the field lines in the region of the equator run tangentially to the earth's surface. Direction 22 of FIG. 2 thereby depends on the corresponding latitude at the earth's surface.

Inside the earth the dependence of the field lines cannot be described in this simple fashion since the earth's magnetic field has its origin in electrical current systems inside the earth which, in turn, are below the core-mantle interface at a depth of approximately 2.900 kilometers. Even the rocky material in the earth's crust which produces the so-called crust field affects the direction of the earth's magnetic field lines within the earth.

The dependance of the earth's magnetic field lines within the earth is well known since in the field of paleomagnetism, the magnetization direction is measured at stone samples in order to thereby derive the so-called pole drift curves which, for example, have verified the hypothesis that the current portions of the earth originally belonged to one single giant continental mass the so-called Pangea. Within the framework of paleomagnetism the earth's magnetic field is still continuously measured today in order to monitor the so-called secular variations, that is to say, the slow time changes of the earth's main field with a periodicity of several hundred years.

Since, on the other hand, the earthquake-active regions of the earth's surface are also well known, it is not difficult for one of average skill in the art, at every measurement position in the vicinity of the earth's crust, to extract the local direction of the earth's magnetic field from available measurements or, if necessary, to measure it. No particular difficulties are thereby encountered since the measurement positions, as mentioned are fixed and their locations must not be varied.

It is known in the art that the local largely homogeneous earth's magnetic field has a magnitude of approximately 0.5 Gauss (50 $\mu$t). The earth's magnetic field $B_0$ can thereby be utilized for the production of a proton nuclear magnetic resonance, that is to say, hydrogen atoms in the molecules of the earth's crust can be utilized.

Figure 3:
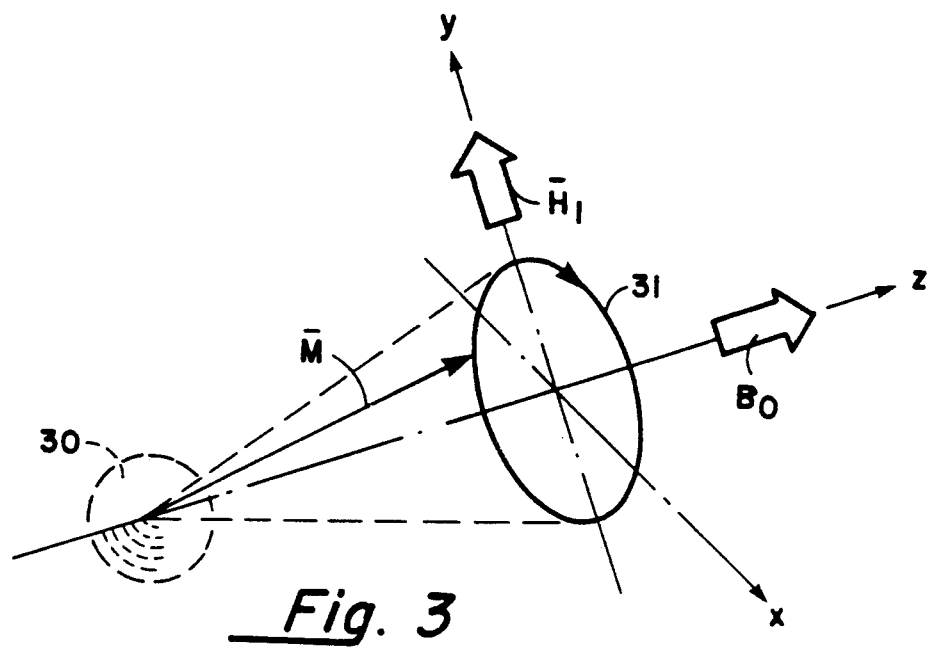
FIG. 3: An illustrative description of nuclear magnetic resonance.

FIG. 3 is an extremely schematic representation of such a proton 30 whose magnetization vector M is directed along the earth's magnetic field $B_0$ and precesses along a path 31 about this direction which is coincident with the fictitious z axis of the coordinate system in FIG. 3. If one applies an electromagnetic alternating field $H_1$ in a plane x/y orthogonal to the z direction, as symbolized with an additional arrow in FIG. 3, it is thereby possible to synchronize all the precession motions of the magnetization vectors M of all protons 30 in a particular spatial region. The frequency of the electromagnetic alternating field $H_1$ is determined by the strength of the effective constant field, in this case the earth's magnetic field $B_0$, and, in fact, via the so-called gyromagnetic ratio which characterizes the quotient of the frequency to the field strength for every nuclear resonance active nuclear species. With protons the gyromagnetic ratio assumes a value of approximately 4 kHz/G so that in the earth's magnetic field of 0.5 Gauss, a nuclear resonance frequency of approximately 2 kHz occurs. This corresponds to a vacuum wavelength of approximately 150 kilometers or a wavelength in water, whose dielectric constant can be approximately taken to be 9, of about 17 kilometers.

As already mentioned, the electromagnetic alternating field $H_1$ irradiated to excite the nuclear resonance must be perpendicular to the direction of the existing constant field. Since the field lines 21 of the electromagnetic alternating field of the coil 15 in FIG. 2 are curved the corresponding projection of the field strength vector $H_1$ at every point in the spatial region must be considered.

A first point 23 in FIG. 2 indicates that the projection of the field strength vector $H_1$ assumes a value of $H_{1R}$ since at the first point 23 the field lines cut through the direction 22 of the earth's magnetic field $B_0$ at a relatively acute angle. In contrast, at a second point 24, the projection $H'_{1R}$ and the field strength vector $H'_1$ are approximately equal since, at the second point 24, the field lines cut the direction 22 at an angle of approximately 90°. In contrast, at a third point 25, the projection $H''_{1R}$ is again smaller than the vector $H'_1$. However, the intensity of the projections $H_{1R}$, $H'_{1R}$ and $H''_{1R}$ increase from the first point 23 to third point 25 since the intensity of the field strength of the electromagnetic alternating field $H_1$ increases towards the coil in the direction of the coil axis 20.

In general this means that, in a practically realizable irradiation of an electromagnetic alternating field $H_1$, a defined spatial distribution of the field strength vectors $H_1$ according to magnitude, direction, and phase can be assumed.

Figure 4:
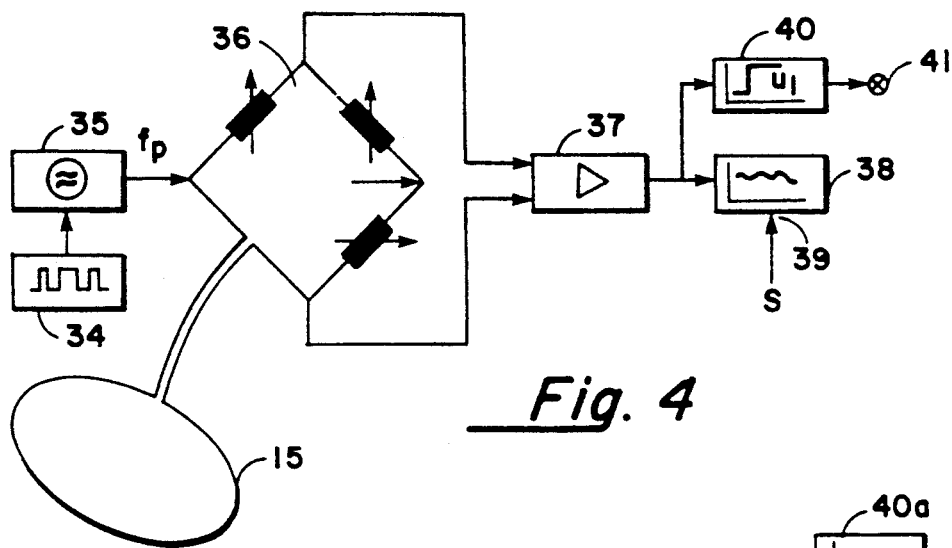
FIG. 4: A first block circuit diagram of a bridge circuit for a nuclear resonance apparatus applied in accordance with the invention.

FIG. 4 shows a block circuit diagram with which, by way of example, a pulse generator 34 controllable sender 35 feeds a bridge circuit 36 which exhibits adjustable normalized complex resistances in three bridge-branches and has, in a fourth bridge branch, the sender coil 15. In the transverse branch of the bridge connector 37, an amplifier 37 is arranged whose output side is connected to a recorder 38 or to another kind of storage device to which, by means of an input 39, a signal s can be fed. The output of the amplifier 39 is furthermore connected to a threshold stage 40 which, for its part, drives an alarm indicator 41.

In the event of the utilization of the pulse generator 34 for the excitation of pulsed nuclear resonances, as will be described below in connection with the FIGS. 6 through 10, a switch can be advantageously provided for before the amplifier 37 in order to block the input to the amplifier 37 during the duration of the pulse and to open it during the pulse pauses.

Figure 5:
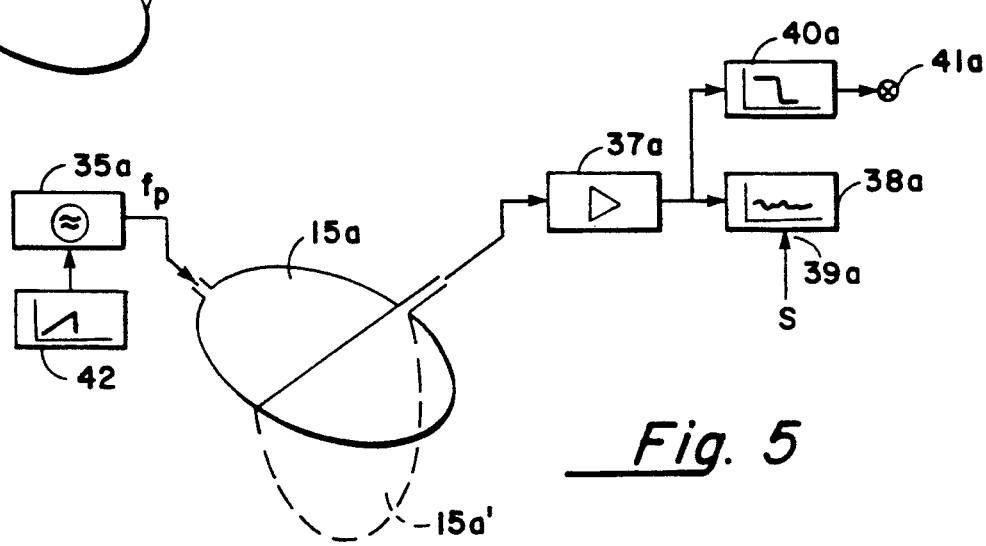
FIG. 5: A second block circuit diagram of a nuclear resonance apparatus applied in accordance with the invention in an induction configuration.

In contrast, FIG. 5 shows a varied configuration with which a sender 35a, which is controllable by means of a tuning device 42, feeds a sending coil 15a only. A receiving coil 15a', which is galvanically separated from the sending coil 15a, whose coil surface area is preferentially perpendicular to the coil surface area of the sending coil 15a, is connected to an amplifier 37a which, in turn, is connected to the subsequent circuit elements already described in FIG. 4. Towards this end the receiving coil 15a' can, for example, be buried.

The functioning of the configuration in accordance with FIGS. 4 and 5 is as follows:

Should, in accordance with the configuration of FIG. 4, the doubly funtioning sender and receiver coil 15 be located on the earth's surface 11, then, with the above described adjustment of the frequency of the sender 35 to the proton resonance frequency $F_P$, proton resonances in the protons of the material of the earth's crust 10 in the vicinity of the sending coil 15 are excited. Thereby the complex resistance of the sending coil 15 changes, which leads to a corresponding detuning of the bridge circuit 36. Through adjustment of the complex reference resistance of the bridge circuit 36 it is possible for the voltage in the transverse branch to be adjusted to 0 during the measurement.

Should however the chemical composition of the material of the earth's crust change as a direct consequence of an accumulated tectonic pressure or indirect consequence of a pressure or temperature increase, the received resonance signal thereby changes correspondingly since a different quantity of protons are now excited to proton resonance. The resonance signal received by the sender/receiver coil 15 is thereby reduced to the extent that the chemical composition of the material of the earth's crust 10 changes.

In the threshold stage 40 it is possible for a threshold value $U_1$ of the voltage U in the transverse branch of the bridge circuit 36 to be preset, Which would lead to a release of the alarm indicator 41.

In contrast, in the configuration of FIG. 5, a maximum nuclear resonance signal is always induced in the receiver coil 15a' which is orthogonal to the sending coil 15a since the circulating magnetization vector M (compare FIG. 3) also induces a measurement voltage in a coil directed perpendicularly to the direction of the high frequency field $H_1$, without having the detection coil 15a itself overlap with the excitation field $H_1$.

Should the chemical constitution of the material of the earth's crust 10 change, the produced nuclear resonance signal thereby changes in the manner which has already been described and the voltage which is induced in the receiver coil 15a' changes. In this case as well, one adjusts the threshold stage 40a in such a manner that, when exceeding a certain limiting value (for example a window), the alarm indicator 41a is set-off. In an advantageous fashion one can also monitor whether or not the measured proton density has changed more rapidly than a preset value.

The pulse generator 34 in FIG. 4 as well as the tuning unit 42 in FIG. 5 can, rather than producing a continuous wave signal of constant frequency and amplitude, be used to produce a sampled continuous wave signal or a frequency variable signal or a signal of variable amplitude or a noise signal or a combination of these signals as will be further described and explained below.

In particular, the application of a frequency variable signal or a pulsed excitation with subsequent Fourier transformation allows for the taking of spectra and not only for the measurement of a voltage which is a direct indication of the proton concentration. With a spectrum accumulation it is furthermore possible to monitor structural changes in the material of the earth's crust which manifest themselves, for example, as changes in the line shape of the spectrum, as changes in the line separation or in the appearance or disappearance of lines in general.

In the above described embodiments one has, in general, assumed that the nuclear magnetic resonance is excited utilizing the earth's magnetic field $B_0$ as the constant field. Clearly, however, externally produced static magnetic fields can also be applied in addition to the earth's magnetic field $B_0$ and, in fact, with all types of coil configurations which have, in an exemplary fashion, been explained in connection with the transmitter coil 15. With such an externally excited static magnetic field, it is possible for the magnetic field strength to be increased from the relatively low value of 0.5 Gauss of the earth's magnetic field $B_0$ by one or more orders of magnitude so that, with a correspondingly adjusted measurement frequency, an increase in the signal intensity also occurs which, in nuclear resonance experiments, is approximately proportional to the measurement frequency.

Since, when utilizing a coil, the intensity of the magnetic field strength, with a electromagnetic alternating field as well as with a constant field, depends on the Ampére-winding number, in an embodiment of the invention, a coil which is wound from superconducting wire is utilized as magnet coil. This kind of superconducting coil allows for, as is known in the art, very high Ampé re-winding numbers to be achieved without requiring the electrical power which is needed for normally conducting air coil configurations. It is particularly preferred in applications of the kind of interest here, to utilize modern high temperature superconductors of ceramic base, as already known in the art today at temperatures on the order of magnitude of liquid nitrogen and above. Furthermore, with the embodiments which have been described up to this point, it has solely been determined whether a significant change in the chemical composition of the material of the earth's crust 10, within the monitored spatial region, is present or not.

In order to, above and beyond this, also determine an exact position of the point of change, further embodiments of the invention are described below which allow for such a position determination.

In a first group of embodiments the method of pulsed nuclear resonance is utilized towards this end.

Figure 6:
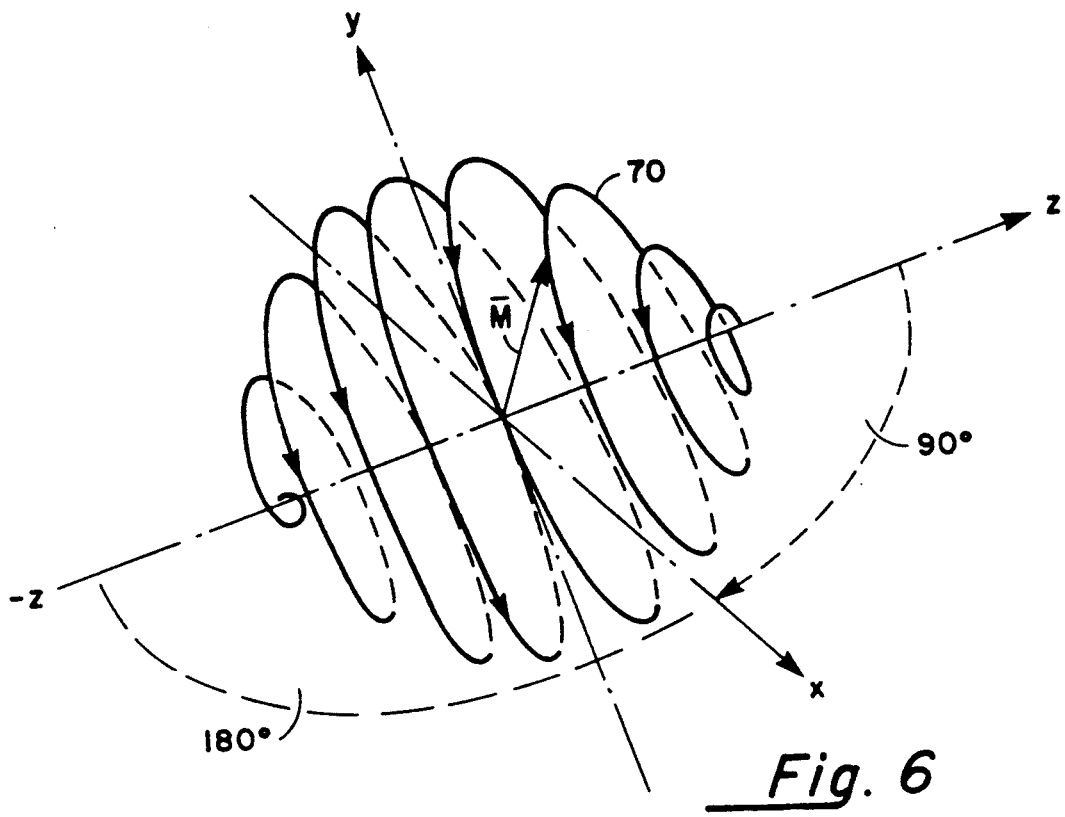
FIG. 6: Illustrative description of a pulsed nuclear resonance.

In order to illustrate this FIG. 6 shows a representation similar to FIG. 3. During the steady-state condition of FIG. 3, wherein the magnetization vector M of a proton precesses smoothly about the coordinate direction z of the direction of the effective constant field, the proton is excited by means of a high frequency pulse, that is to say with a sampled constant wave signal at the proton resonance frequency with adjustable time duration and adjustable amplitude. The tip of the magnetization vector M which, from its state of rest of FIG. 3, is exposed to such a high frequency pulse, transcribes a spiral-shaped orbit 70 in space as is represented in FIG. 6. Depending on the amplitude size and the time duration adjustments of the high frequency pulse, the magnetization vector M is tipped out of the z direction, for example, by 90° into the x/y plane or even by 180° into the -z direction. In the first case, one speaks of a so-called 90° pulse and in the second case of a so-called 180° pulse.

Figure 7:
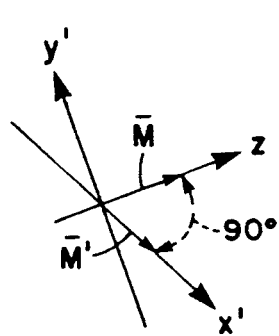
FIG. 7: through 9 A vector representation for the explanation of a nuclear resonance spin echo experiment.
Figure 8:
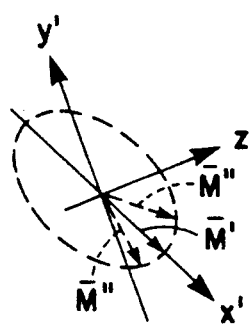
Figure 9:
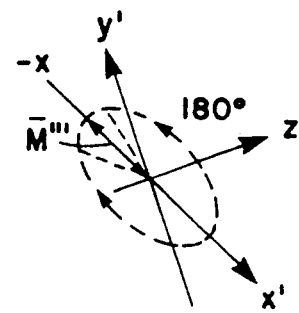

FIG. 7 shows, in the so-called "rotating system x'/y'" an experiment in which a 90° pulse is imposed upon a substance whose spins are characterized by a common magnetization vector M in the z direction. The magnetization vector M is hereby rotated out of the z direction by 90° by way of example into the x' direction as indicated in FIG. 7 with M'. In consequence of field inhomogeneities, the magnetization vectors fan out of the x' direction to both sides as indicated with M" in FIG. 8. If the spin system at this point of time is then subjected to a 180° pulse, the fanned out magnetization vectors M" in the x'/y' plane begin to run in an opposite direction and run together at approximately the same point in time in the direction of the $-x'$ axis. This so-called rephasing manifests itself in a measurable echo effect. Further details about the so-called spin echo technique can by way of example be read in the book by Laukien, Nuclear Magnetic Resonance High Frequency Spectroscopy in Flügge, Handbuch der Physik, Band XXXVIII/1, Springer 1958, pages 120 through 376.

Towards this end FIG. 10 shows a pulse sequence with which 73 represents the 90° pulse of FIG. 7. Through the folding-over of the magnetization vector M, an induction signal 74 occurs which, however, decays rapidly due to field inhomogeneities. 75 indicates a subsequent 180° pulse in accordance with FIGS. 8 and 9 which, in the above described manner, leads to a spin echo 76. The 180° pulse can be repeated at 77 and also even later, whereby further spin echos 78 etc. occur.

One can take advantage of this pulse technique in the present context by considering that the pulse sequence represented in FIG. 10 effects a rephasing of the magnetization vectors only if the amplitudes and lengths of the pulses are such as to effect a reversal of the magnetization vector M largely by 90° or 180° respectively.

In the monitored spatial region, the lengths of the pulses 73, 75 and 77 do not change. However, the amplitudes of these pulses change as was explained above in connection with FIG. 2 in consequence of the spatially decreasing intensity of $H_1$.

Figure 11:
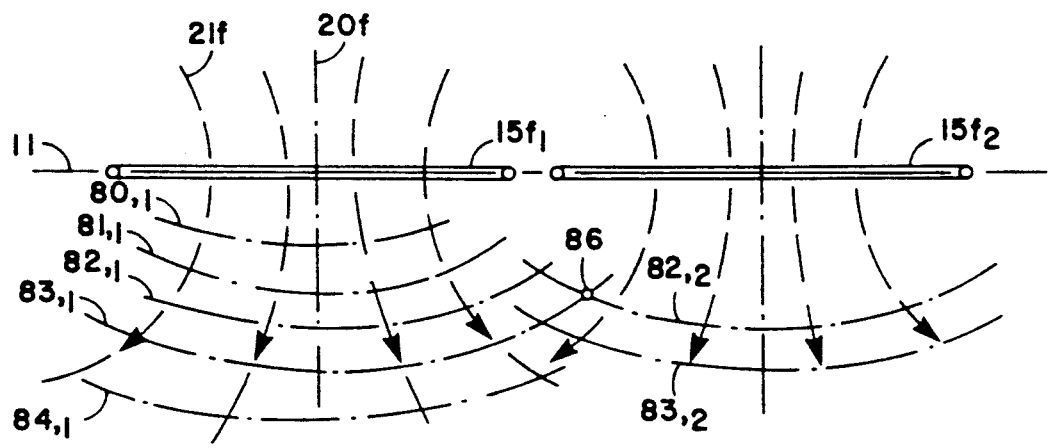
FIG. 11: a further representation similar to FIG. 2 for the explanation of a depth encoding with the assistance of a variation of the field strength of an electromagnetic alternating field.

A configuration in accordance with the invention is represented in FIG. 11 with which two transmitting coils $15f_1$ and $15f_2$ are arranged next to each other on the surface of the earth 11. $20f$ labells the coil axis of the transmitting coil $15f_1$ and $21f$ an associated field line. The lines 80/1 through 84/1 in FIG. 11 (or, in a spatial representation, areas) depict equal field strengths of the electromagnetic alternating field produced by the transmitting coil $15f_1$. It is thereby assumed that, on the line 83/1, exactly that field strength is present which would be exercised by a 180° pulse on those protons which are located on the line 83/1. If one would investigate a volume selective spatial region indicated with 86 for the change of proton density or for a spectral change in the NMR spectrum, such a change would be recognized, since the nuclear resonance signal produced selectively by the 180° pulse at the line 83/1 is, for example, smaller than one from the other lines 82/1 or 84/1 when taking into consideration the nuclear resonance signal produced by the locally obtaining field strength $H_1$, said signal not being effected by the change in 86. In the second transmitting coil $15f_2$, in contrast, no change in the nuclear resonance signal at the corresponding line 83/2 is registered since the position of the change (point 86) is not on the line 83/2. If one changes, however, the current in the second coil $15f_2$, so that the 180° condition is only fulfilled on the line 82/2, a signal change will thereby occur there since in this case the change is effective at 86.

Since the spatial variation of the intensity of the magnetic field strength of the electromagnetic alternating field which is produced from the coils $15f_1$ and $15f_2$ is known, the volume selective region 86 can be determined through measurements with varying excitation currents in the coils $15f_1$ and $15f_2$ as the point of intersection of the lines 83/1 and 82/2.

In this manner volume selective measurements inside of the earth's crust are possible. One can, thereby, "select", for example, moving water running at large depths into ground water in order, for example, to determine at a particular point of the running water, the mineral composition of the ground water either quantitatively or qualitatively (spectral)

FIG. 12 shows, in an illustrative fashion, that variation in the excitation current of the coils $15f_1$ and $15f_2$ according to FIG. 11 can be translated into a two dimensionsal coordinate grid 89 with which, at the abscissa, a distance s on the earth's surface and on the ordinate the depth T is plotted. Through cyclic switching of the excitation current of the electromagnetic alternating field in the fixed coils $15f_1$ and $15f_2$ it is possible to examine each segment 90 of the coordinate grid 89 through stepwise increases and decreases of the excitation current. If a spatial region of the earth's crust changes significantly, as far as the occurrance of earthquakes is concerned, and exhibits larger dimensions than the side lengths of the segments 90, a two dimensional silhouette 91 of this region can be represented. From the shape of this silhouette 91 it is possible to determine not only the depth T and the position S, but the shape of the silhouette is, moreover, a further criteria for whether or not an earthquake is impending.

If one adds, in addition to both coils $15f_1$ and $15f_2$ of FIG. 11, a third coil perpendicular to the plane of the drawing then it is possible to also achieve a three dimensional resolution. This leads to a three dimensional coordinate grid whose spatial segments can be likewise cyclically sampled through stepwise changes in the excitation currents of the three coils in order to determine that three dimensional segment in which the proton resonance changes in a predetermined fashion.

The above, in connection with FIG. 11 and 12, described method for selective dimensioning of two dimensional segments 90 or three dimensional segments of a two or three dimensional coordinate grid 89 is only one of many examples.

There are, moreover, numerous other imaging or volume selective methods and devices which can be applied as known in the art of nuclear spin tomography as, for example, described by Roth in NMR-Tomographie und Spektroskopie in der Medizin, Springer 1984.

In these methods, a constant magnetic field is overlapped with one or more so-called gradient fields. Gradient fields are static magnetic fields whose intensities vary spatially in a particular fashion. If one superimposes a plurality of this type of gradient field upon the constant magnetic field, it is thereby possible to effect a magnetic encoding of the spatial region in which each point in the spatial region, at a particular time, can be correlated to a particular intensity value of the constant field. Each of these points corresponds thereby to a particular resonance frequency since the gyromagnetic ratio is a constant. Through variation of the frequency of the electromagnetic alternating field it is thereby possible to successively chose and selectively sequentially examine the various points within the spatial region for their proton content. The frequency variation can thereby either be achieved in that one adiabatically tunes the frequency of the electromagnetic alternating field, that is to say, a so-called "frequency sweep" is enacted, or, however, as is also possible with methods known in the art of nuclear spin tomography, to effect a wideband excitation of the spatial region with a plurality of frequencies and by means of Fourier transformation to analyse and image the spatial resonant response of the spin system. The methods and procedures which are thereby necessary are in and of themselves known in the art of nuclear spin tomography and therefore will not, in detail, be described again here.

I claim:

1. A method for warning of the future occurrence of an earthquake using magnetic spin resonance apparatus, the method comprising the steps of:
   A. monitoring a physical parameter of the earth's crust by means of the magnetic spin resonance apparatus to produce monitored values; and
   B. generating an alarm when any one of the monitored values of the parameter exceeds a predetermined threshold value to warn of the imminent occurrence of an earthquake.

2. The method according to claim 1, wherein step A comprises the step of:
   A1. monitoring the physical parameter by repeatedly measuring a nuclear magnetic resonance signal generated by the earth's crust.

3. The method according to claims 2 or 2, wherein step A comprises the step of:
   A2. utilizing the earth's magnetic field as a main static field in the magnetic spin resonance apparatus.

4. The method according to claim 1, wherein step A comprises the steps of:
   A3. selecting a volume of predetermined size in the earth's crust; and
   A4. monitoring the physical parameter within the volume selected in step A3 by means of the magnetic spin resonance apparatus.

5. The method according to claim 1, wherein step A comprises the steps of:
   A5. selecting a volume of predetermined size in the earth's crust; and
   A6. making repeated measurements of the chemical composition of the predetermined size volume.

6. The method of claim 5 wherein step A6 comprises the steps of:
   A6A. monitoring the temperature in the predetermined volume;
   A6B. selecting chemical composition measurements made in step A6 which correspond to time periods during which temperature measurements made in step A6A indicate a temperature change; and
   A6C. using the measurements selected in step A6B as the monitored values.

7. The method of claim 5 wherein step A6 comprises the steps of:
   A6D. monitoring the pressure in the predetermined volume;
   A6E. selecting chemical composition measurements made in step A6 which correspond to time periods during which pressure measurements made in step A6A indicate a pressure charge; and
   A6F. using the measurements selected in step A6B as the monitored values.

8. A method for generating an alarm indicating that an earthquake is imminent using nuclear magnetic spin resonance apparatus, the method comprising the steps of:
   A. measuring a physical parameter of the earth's crust by means of the nuclear magnetic spin resonance (NMR) apparatus to produce a measurement value;
   B. utilizing the earth's magnetic field as a main static field in the nuclear magnetic spin resonance apparatus used in the measurement conducted in step A;
   C. comparing the measurement value obtained in step A to a predetermined threshold value;
   D. repeating steps A, B and C at predetermined time intervals; and
   E. generating the alarm if the comparison in step C indicates that the measured value of the parameter exceeds the predetermined threshold value.

9. The method according to claim 8, wherein step A comprises the steps of:
   A1. selecting a volume of predetermined size in the earth's crust; and
   A2. measuring the physical parameter within the volume selected in step A1 by means of the nuclear magnetic spin resonance apparatus.

10. The method according to claim 8, wherein step A comprises the steps of:
    A3. selecting a volume of predetermined size in the earth's crust; and
    A4. making repeated measurements of a selected chemical composition in the predetermined size volume.

11. The method of claim 10 wherein step A4 comprises the steps of:
    A4A. monitoring the temperature in the predetermined volume;
    A4B. selecting chemical composition measurements made in step A4 which correspond to time periods during which temperature measurements made in step A4A indicate a temperature change; and
    A4C. using the measurements selected in step A4B as the monitored values.

12. The method of claim 10 wherein step A4 comprises the steps of:
    A4D. monitoring the pressure in the predetermined volume;
    A4E. selecting chemical composition measurements made in step A4 which correspond to time periods during which pressure measurements made in step A4A indicate a pressure change; and
    A4F. using the measurements selected in step A4B as the monitored values.

13. Apparatus for warning of the future occurrence of an earthquake, the apparatus comprising:
    a high-frequency transmitter for generating a radio frequency oscillating magnetic field with a frequency;
    a transmitting coil located on a surface of the earth and connected to the transmitter for radiating the radio-frequency oscillating magnetic field into the earth's crust; means responsive to a magnitude of the earth's magnetic field in a subterranean volume in the earth's crust and connected to the transmitter for adjusting the frequency of the oscillating magnetic field to a value that produces magnetic resonance in selected nuclei in the subterranean volume in the earth's crust using the earth's magnetic field in the subterranean volume as a main static field;
    a receiver located on the earth's surface for detecting spin resonance signals generated by the selected nuclei at predetermined time intervals; and
    means responsive to the spin resonance signals for repetitively comparing the spin resonance signals to a predetermined threshold and for generating an alarm when the spin resonance signals exceed the predetermined threshold value to warn of the imminent occurrence of an earthquake.

14. Apparatus for warning of the future occurrence of an earthquake, the apparatus comprising:

a high-frequency transmitter for generating a radio-frequency oscillating magnetic field with a frequency;

a transmitting coil located on a surface of the earth and connected to the transmitter for radiating the radio-frequency oscillating magnetic field into the earth's crust;

means for generating a main static magnetic field with a magnitude in a selected subterranean volume of the earth's crust;

means responsive to the magnitude of the main static magnitude field and connected to the transmitter for adjusting the frequency of the oscillating field to a value that produces magnitude resonance in selected nuclei in the subterranean volume in the earth's crust;

a receiver located on the earth's surface for detecting spin resonance signals generated by the selected nuclei;

a controller for controlling the transmitter and the receiver to generate and detect spin resonance signals at predetermined time intervals; and means responsive to the spin resonance signals for comparing each of the detected spin resonance signals to a predetermined threshold value and for generating an alarm when the spin resonance signals exceed the predetermined threshold value to warn of the imminent occurrence of an earthquake.

* * * * *